(12) United States Patent
Herrmann

(10) Patent No.: US 10,555,415 B2
(45) Date of Patent: Feb. 4, 2020

(54) METHOD FOR MANUFACTURING A PRINTED CIRCUIT BOARD

(71) Applicant: SMR Patents S.à.r.l., Luxembourg (LU)

(72) Inventor: Andreas Herrmann, Winnenden-Baach (DE)

(73) Assignee: SMR Patents S.à.r.l., Luxembourg (LU)

( * ) Notice: Subject to any disclaimer, the term of this patent is extended or adjusted under 35 U.S.C. 154(b) by 80 days.

(21) Appl. No.: 15/819,857

(22) Filed: Nov. 21, 2017

(65) Prior Publication Data

US 2018/0077795 A1 Mar. 15, 2018

Related U.S. Application Data

(63) Continuation-in-part of application No. 14/452,640, filed on Aug. 6, 2014, now abandoned.

(51) Int. Cl.

| H05K 1/02 | (2006.01) |
|---|---|
| H05K 1/18 | (2006.01) |
| H05K 3/00 | (2006.01) |
| H05K 3/34 | (2006.01) |
| H05K 1/14 | (2006.01) |
| H05K 3/36 | (2006.01) |

(52) U.S. Cl.
CPC ......... *H05K 1/0292* (2013.01); *H05K 1/0201* (2013.01); *H05K 1/028* (2013.01); *H05K 1/14* (2013.01); *H05K 1/181* (2013.01); *H05K 3/0014* (2013.01); *H05K 3/341* (2013.01); *H05K 3/361* (2013.01); *H05K 2201/09118* (2013.01); *H05K 2201/10386* (2013.01)

(58) Field of Classification Search
CPC ......... H01L 23/02; H01L 23/16; H01L 23/54; H05K 1/0201; H05K 1/028; H05K 1/0292; H05K 1/14; H05K 1/181; H05K 3/0014; H05K 3/341; H05K 3/361; H05K 2201/09118; H05K 2201/10386
See application file for complete search history.

(56) References Cited

U.S. PATENT DOCUMENTS

| 5,110,298 A | 5/1992 | Dorinski et al. |
| 5,219,292 A | 6/1993 | Dickirson et al. |

(Continued)

FOREIGN PATENT DOCUMENTS

| CA | 2086825 A1 * | 11/1992 |
| DE | 29623310 U1 | 2/1998 |

(Continued)

*Primary Examiner* — Carl J Arbes
(74) *Attorney, Agent, or Firm* — Jones Day

(57) ABSTRACT

A method of making a printed circuit board and a printed circuit board including a plurality of plastic substrate parts having one or more first substrate parts each having at least one coupling means, and one or more second substrate parts each having at least one receiving means to receive the coupling mean. At least one of the plurality of plastic substrate parts is formed with a further structural element, and at least two of the plurality of plastic substrate parts are connected to each other through the at least one coupling means and the at least one receiving means. The connected substrate parts include a circuit.

23 Claims, 2 Drawing Sheets

(56) References Cited

U.S. PATENT DOCUMENTS

| | | | |
|---|---|---|---|
| 5,245,258 A * | 9/1993 | Becker | H02K 5/143 |
| | | | 318/10 |
| 5,938,455 A | 8/1999 | Glovatsky et al. | |
| 6,135,778 A * | 10/2000 | Ubelein | B60J 5/0416 |
| | | | 439/34 |
| 6,356,044 B1 * | 3/2002 | Archer | H02K 11/33 |
| | | | 318/538 |
| 6,956,303 B1 * | 10/2005 | Uebelein | H05K 1/0286 |
| | | | 307/10.1 |
| 7,706,046 B2 | 4/2010 | Bauer et al. | |
| 2001/0015862 A1 | 8/2001 | Lynam et al. | |
| 2006/0132939 A1 | 6/2006 | Blank et al. | |
| 2006/0289201 A1 | 12/2006 | Kim et al. | |
| 2012/0183793 A1 | 7/2012 | John et al. | |

FOREIGN PATENT DOCUMENTS

| | | |
|---|---|---|
| DE | 19951916 C1 | 1/2001 |
| DE | 10105621 A1 | 8/2002 |
| DE | 102010062759 A1 | 6/2012 |
| EP | 0089452 A1 | 9/1983 |
| EP | 0929416 B1 | 1/2001 |
| EP | 2476723 A1 | 7/2012 |
| FR | 2591054 A1 | 6/1987 |
| GB | 739828 | 11/1955 |
| GB | 2366268 A1 | 6/2002 |
| JP | 11261186 A1 | 9/1999 |
| WO | 2013026816 A1 | 2/2013 |

* cited by examiner

METHOD FOR MANUFACTURING A PRINTED CIRCUIT BOARD

CROSS-REFERENCE TO RELATED APPLICATION

This application is a continuation-in-part of U.S. patent application Ser. No. 14/452,640, filed Aug. 6, 2014, which claims priority from German Patent Application No. DE 10 2013 108 535.0, filed Aug. 7, 2013, each of which is incorporated herein by reference in its entirety for all purposes.

BACKGROUND

1. Field

The following description relates to a method for manufacturing a printed circuit board. In at least one example, the printed circuit board includes a substrate and an electric circuit. The printed circuit board may be used for a rear view device of a motor vehicle. The following description also relates to a printed circuit board manufactured in such manner and a rear view device of a motor vehicle including the printed circuit board.

2. Description of Related Art

The shape, dimensions and attached electronic components of known printed circuit boards being manufactured in large volume are adapted to their application. The electric circuit or circuits to be used on or in the boards and their layout are tailor-made, which permits a compact design of the mounting place. It is therefore difficult to use these printed circuit boards for another application or in another place. As a result, a plurality of printed circuit boards need to be planned and made available for the various applications.

Even for identical assemblies, such as a rear view device of a motor vehicle, various printed circuit boards, e. g. having different dimensions, are required for controlling electronic components of the rear view device, depending on the type and electrical components of the rear view device, which is costly.

A method for selectively metallising a substrate is known from European Patent Application No. EP 2 476 723 A1. Laser direct structuring techniques enable the application of circuits in the desired layout on three-dimensional substrates.

Laser welding of two plastic members to be joined is described in International Patent Application Publication No. WO 2013/026816 A1.

German Patent Application No. DE 101 05 621 A1 describes an electric circuit board including a plurality of conductor paths arranged on at least one of its main surfaces and a plurality of connecting elements assigned to them for electrically contacting at least one additional electric circuit board.

An electronic control unit for controlling electrical assemblies of motor vehicle doors with differing equipment is described in German Patent No. DE 199 51 916 C1. Here, circuit boards having electrical structures are to be assembled depending on the equipment.

German Utility Model No. DE 296 23 310 U1 describes a roof module especially for motor vehicles which is connected to an onboard power supply system in order to be linked to other remotely provided apparatuses, and which includes a plurality of functional units, where the interfaces required for the connection to the onboard power supply system are part of one single main printed circuit board fixed in the housing of the roof module. The main printed circuit board includes the functional elements necessary for carrying out the internal control processes and for establishing the internal links of at least two of the functional units.

Chinese Patent Application No. CN 103260364 describes an electric device case having an antenna formed by laser direct molding (LDS) technology.

SUMMARY

In at least one aspect, printed circuit boards are manufactured more efficiently. In another aspect, a method for manufacturing a printed circuit board having a substrate and an electric circuit is more simple and cost-efficient, and expands the range of applications of the manufactured printed circuit board. Additional advantages and aspects of the invention should be appreciated and are not limited to those described.

In an aspect, a method of manufacturing a printed circuit board includes manufacturing a plurality of plastic substrate parts in an injection molding process, where first substrate parts are each formed with at least one coupling means and second substrate parts are each formed with at least one receiving means to receive a coupling means of a first substrate part, at least one of the first and second substrate parts being formed with a further structural element, selecting and connecting at least two of the substrate parts, where a first substrate part is connected to at least a second substrate part through the at least one coupling means and the at least one receiving means, and providing the connected substrate parts with a circuit.

At least one of the coupling means, the receiving means and the structural element may be formed in a single step of injection molding, i.e. by the step of providing a mold complementary to the form of the substrate part with the desired coupling means, receiving means and/or structural element and injecting a polymer mass into the mold. After cooling and unmolding, the resulting substrate part is completely formed. In another example, the method may include an additional step of inserting at least one element forming at least part of the coupling means, receiving means and/or structural element into the mold before injecting the polymer mass.

Some advantages of this method include, but are not limited to, allowing for the inclusion of additional functionality into polymer-based circuit substrates, such as, for example, connectors or fasteners usable to affix the circuit board to other components, or functional elements to increase its mechanical stability. Integrating such elements into the circuit board provides for particularly low manufacturing costs and fast and easy subsequent assembly processes.

In a preferred embodiment, FR4 epoxy glass which is typically used for conventional printed circuit boards is not used as material for the substrates of the present invention. Of particular advantage is the provision of flexible substrates. It is also preferred to provide a plurality of different first or second substrate parts, preferably differing in size and/or geometry.

In a further preferred embodiment at least one of the coupling means and the structural elements provides guiding features facilitating the connection of two substrate parts, in particular facilitating the introduction into a receiving means. The coupling means can be formed as a clip element, a tongue, a hook or the like. The receiving means can be formed as a slot, lug, pocket, recess, undercut or the like.

The further structural element may be a further coupling element, in particular a clip connector. This allows for easy fastening of the circuit board to other structures, for example a casing or a base plate of a rear view mirror. The further structural element may be a positioning element. Such a positioning element, for example, may take the form of a positioning pin or groove or the like. During the assembly of any larger structure including a circuit board, the positioning element can be used to secure the correct orientation of the circuit board, thus avoiding the need for any auxiliary positioning measures.

The further structural element may be a bracing element. Such a bracing element, for example, may be a ridge, a ligament or the like. Bracing elements may help prevent warping of the circuit board and thus possible damages to the circuitry itself.

The further structural element may be a heat sink. A heat sink can help to dissipate thermal energy from the circuit board as a whole or from individual electronic components of the circuit board. Depending on the specific needs of any individual circuit, the heat sink can be thermally coupled to the board as a whole or to individual regions of the circuit board which have a particularly high heat generation during operation.

The heat sink may be formed by providing a metal sheet, like a copper foil, coating the metal sheet during the injection molding process and thermally connecting the metal sheet to the circuit. The heat sink may be provided as an inlay during the injection molding process, i.e, as a separate part which is coated with the plastic mass during injection molding. This allows the ability to provide particularly large heatsinks with high thermal mass and, consequently, high heat dissipation capacity.

The heat sink may be formed concomitantly with the circuit. In this way, the heat sink may be provided in a simple manner, i.e. by the same processes used to apply the metallic coating forming the conductor tracks of the circuit.

The at least one further structural element may be formed during the injection molding process.

In an example, no inlays or other parts are necessary to form the complete substrate, which allows for a particularly easy and fast manufacturing and the use of particularly simple injection molding tools.

The at least one coupling means may include a frictional connection, double friction surfaces, a positive locking, complementary keyed portions, an adhesive force, or a laser weld. Such coupling means allow for a reliable connection between the substrate parts. It is possible to combine different coupling means to achieve a stable connection between the substrate parts. Each first and second substrate part may be formed with at least one surface suited for the application of the circuit after the selecting and connecting step of the at least two of the substrate parts. The circuit may be applied by laser direct structuring (LDS), a molded interconnection device (MID) method, or printing.

The further structural elements may serve to facilitate the application of the circuit by smoothening transitions, compensating relative movements between connected substrate parts, and/or compensating tolerances of the substrate parts dimensions. In this respect, flexibility of at least the further structural elements is an additional advantage.

The circuit element of the first substrate part may be connected to the circuit element of the second substrate part by soldering. To strengthen the overall structure, soldering points can be placed in the region of transitions between two connected substrate parts. The amount of soldering substrate material can be adapted to the transitions and they can provide two tension points. The solder provides additional support for the connection between the substrate parts so their connection is particularly reliable even if exposed to mechanical stress during operation.

The layout of the circuit can be optimized depending on the type and amount of connected substrate parts which provides a high degree of flexibility.

At least one drill hole or bore can be entered into the connected substrate parts and at least partly filled with soldering material during the application of the circuit to enhance heat transfer in particular to a heat sink provided by a structural element.

A printed circuit board may include any circuit carrier, which is provided by connected substrate parts, and does not only include an essentially two-dimensional design but also a three-dimensional design. Electric circuits, respectively circuit parts, may be conductive structures which can be arranged on and/or in the circuit carrier. The printed circuit board may include two or more substrate parts. Preference is given to the provision of different standard substrate parts which can be selected and assembled on a modular basis. The printed circuit board may be suited in particular for being used in an arrangement in or at a rear view device of a motor vehicle.

Known circuit parts can be arranged on or at the associated substrate parts prior to their assembly, but in a preferred example, a circuit will only be arranged on or at the substrate part structure after the assembly, i.e. the connection of substrate parts. The circuit parts of the assembled substrate parts are functionally connected and can interact with each other. Contacts of one circuit part which are raised from one assembly can be arranged such that if a mechanical connection to another assembly including a circuit part exists, a conductive contact is automatically established between the contacts. In another example, the circuit parts of various assemblies can be connected by means of other known techniques, e.g. using solder straps, plugs, wires, etc.

The circuit may be applied by laser direct structuring after having been assembled into a printed circuit board. By arranging the circuit after the assembly it can be arranged continuously by laser direct structuring, whereby a subsequent functional connection of conductive structures on the other substrate parts can be omitted. The substrate parts can be made from different or the same materials, in particular from plastic and/or ceramics.

One or more substrate parts may have a receiving element for an electrical load, such as a lamp. A power supply may also be connectable to the circuit parts on the substrate parts.

Further features and advantages can be derived from the following schematic drawing, wherein the embodiments of the invention are shown in the drawing by way of example and are in no way restrictive.

DETAILED DESCRIPTION

The present invention will now be described with occasional reference to the specific embodiments of the invention. This invention may, however, be embodied in different forms and should not be construed as limited to the embodiments set forth herein. Rather, these embodiments are provided so that this disclosure will be thorough and complete, and will fully convey the scope of the invention to those skilled in the art.

Unless otherwise defined, all technical and scientific terms used herein have the same meaning as commonly understood by one of ordinary skill in the art to which this invention belongs. The terminology used in the description of the invention herein is for describing particular embodiments only and is not intended to be limiting of the invention. As used in the description of the invention and the appended claims, the singular forms "a," "an," and "the" are intended to include the plural forms as well, unless the context clearly indicates otherwise.

Unless otherwise indicated, all numbers expressing quantities of dimensions such as length, width, height, and so forth as used in the specification and claims are to be understood as being modified in all instances by the term "about." Accordingly, unless otherwise indicated, the numerical properties set forth in the specification and claims are approximations that may vary depending on the desired properties sought to be obtained in embodiments of the present invention. Notwithstanding that the numerical ranges and parameters setting forth the broad scope of the invention are approximations, the numerical values set forth in the specific examples are reported as precisely as possible. Any numerical values, however, inherently contain certain errors necessarily resulting from error found in their respective measurements.

Figure 1:
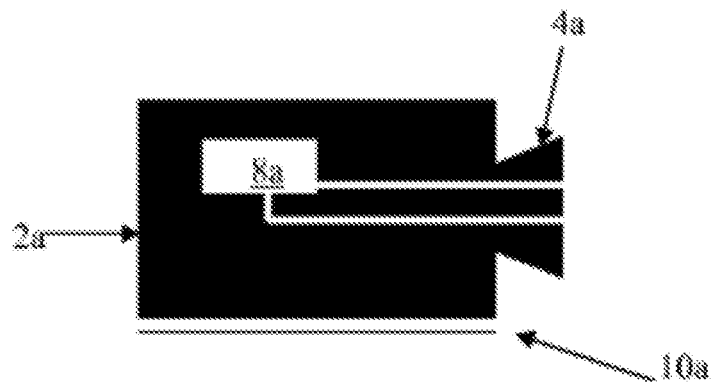
FIG. 1 is a diagram illustrating a first printed circuit board body.

FIG. 1 is a diagram illustrating a first printed circuit board body.

Referring to the example illustrated in FIG. 1, a first printed circuit board body 10*a* includes a first substrate part 2*a* having coupling means 4*a* and a first circuit part 8*a*, which are already arranged on the first substrate part 2*a*. According to the invention, however, either of the first circuit part 8*a* and coupling means 4*a* can be arranged by known techniques even after the assembly of two or more substrate parts.

The first printed circuit board body 10*a* shown in the embodiment of FIG. 1 includes only one coupling means 4*a*, but it can also include additional coupling means or corresponding receiving means such that any number of printed circuit board bodies having the same, similar or different layouts can be connected with each other.

Figure 2:
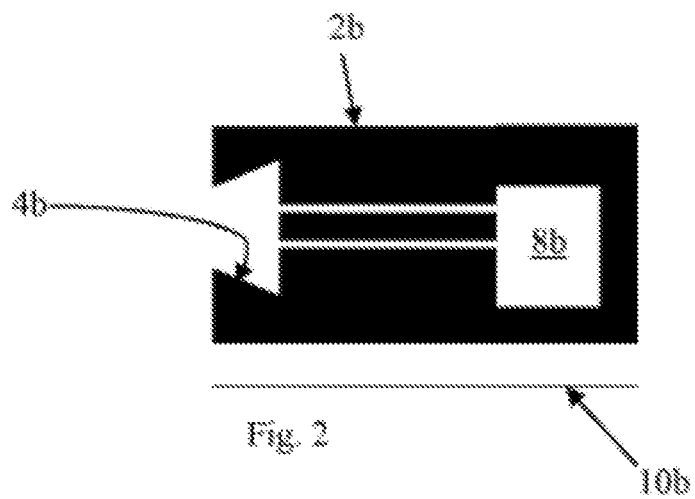
FIG. 2 is a diagram illustrating a second printed circuit board body.

FIG. 2 is a diagram illustrating a second printed circuit board body.

Referring to the example illustrated in FIG. 2, a second printed circuit board body 10*b* includes a second substrate part 2*b* having receiving means 4*b* and a second circuit part 8*b*. The receiving means 4*b* of the second printed circuit board body 10*b* is designed such that it can be detachably connected with the receiving means 4*a* of the first printed circuit board body 10*a* in a positive locking way. A complementary shaped key or portion is one example of a positive locking coupling mode.

When the first printed circuit board body 10*a* is joined with the second printed circuit board body 10*b*, the coupling means 4*a* and the receiving means 4*b* engage with each other such that they are positively locked with each other. In another example, the coupling means 4*a* and the receiving means 4*b* can have different forms and do not need to completely engage with each other. In particular, the printed circuit board bodies 10*a*, 10*b* can contact each other only partly or only at the contact points of the coupling means and the receiving means 4*a*, 4*b*.

Figure 3:
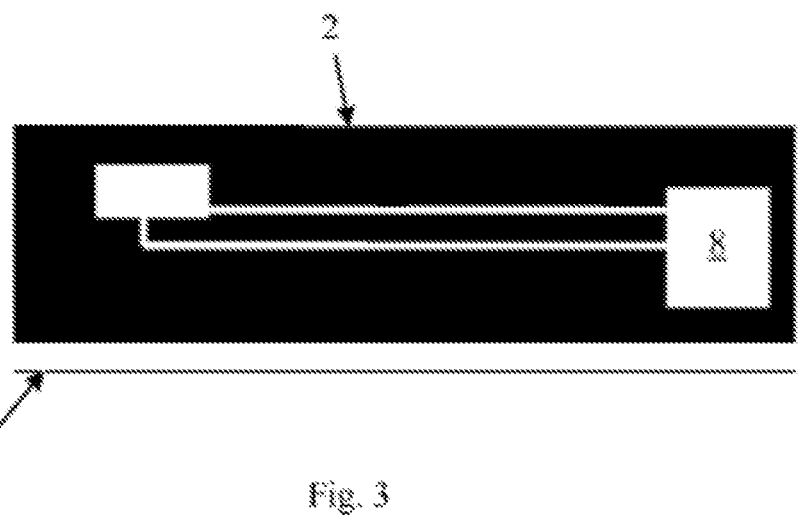
FIG. 3 is a diagram illustrating an example of a printed circuit board.

FIG. 3 is a diagram illustrating an example of a printed circuit board.

Referring to FIG. 3, a printed circuit board 10 includes the first printed circuit board body 10*a* and the second printed circuit board body 10*b*. The first and the second printed circuit board bodies 10*a*, 10*b* are positively locked with each other by the coupling means 4*a* and the receiving means 4*b* of the two substrate parts 2*b*, 2*b*. Moreover, both circuit parts 8*a*, 8*b* are conductively connected with each other. As a result, there is a printed circuit board 10 with a substrate 2 including two substrate parts 2*a*, 2*b* and one circuit 8 including two circuit parts 8*a*, 8*b*.

In one exemplary embodiment the second printed circuit board body 10*b* can provide a power supply, whereas the first printed circuit board body 10*a* can be provided with loads such as sensors, motors, lamps or corresponding control units, which are to be connected to the power supply. In the exemplary case of a rear view device for a motor vehicle, a mirror can have a larger or smaller number of electrical loads, depending on the vehicle's trim level. A power supply on a printed circuit board body can be designed such that it can be used for two or more trim levels, i.e. power can be supplied to a varying number of loads.

Furthermore, a plurality of printed circuit board bodies, in particular each including at least one coupling means and at least one receiving means, can have a circuit with a continuously conductive structure, which is preferably available both at the coupling means and the receiving means. Additional printed circuit board bodies attached to it can thus be connected to this continuously conductive structure. For example, a timing and/or data line and/or a power supply can be used in the conductive structures of a plurality of printed circuit board bodies. The power supply provided by one printed circuit board body can, for example, be used for loads on a plurality of printed circuit board bodies.

In an example, the coupling and receiving may have different designs or shapes such that only those coupling and receiving means with matching designs or shapes can be connected with each other to create a useful connection of the conductive structures.

In an example of manufacturing a rear view device, such as a motor vehicle rear view mirror or a display, a housing may be provided. This can be a known housing of a vehicle rear view mirror. Then a first printed circuit board body 10*a* having at least one coupling means 4*a* and a second printed circuit board body 10*b* having at least one receiving means 4*b* may be provided. The first printed circuit board body 10*a* is fastened by means of the coupling means 4*a* to the second printed circuit board body 10*b* by means of the receiving means 4*b*. This fastening can be a releasable or a permanent connection. Furthermore, a circuit 8 is fastened to the first printed circuit board body 10*a* by means of a first circuit part 8*a* and to the second printed circuit board body 10*b* by means of a second circuit part 8*b*. The circuit 8 can optionally be arranged on a first substrate part 2*a* of the first printed circuit board body 10*a* and on a second substrate part 2*b* of the second printed circuit board body 10*b* by way of laser direct structuring. As mentioned above, the circuit 8 can be an electrically conductive structure. Electric circuits and/or loads can also be arranged on the printed circuit board bodies.

In some embodiments, at least a portion of the electrical circuit 8 extends to an edge of the a substrate part, and includes one or more contact surfaces for making electrical connections to other portions of the electrical circuit 8 that are on an adjacent substrate portion. For example, the electrical connections of the circuit 8 may pass through the coupling means area of the substrates. In this way, the complete circuit may span multiple substrate parts.

Figure 4:
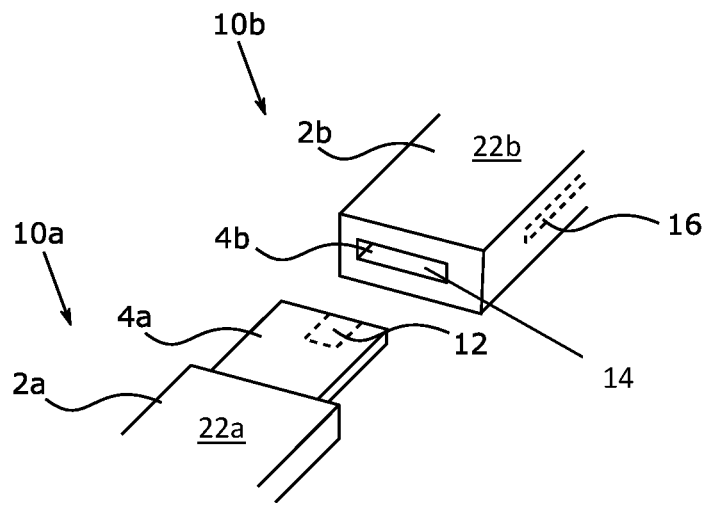
FIG. 4 is a diagram illustrating another example of a printed circuit board body.
Figure 5:
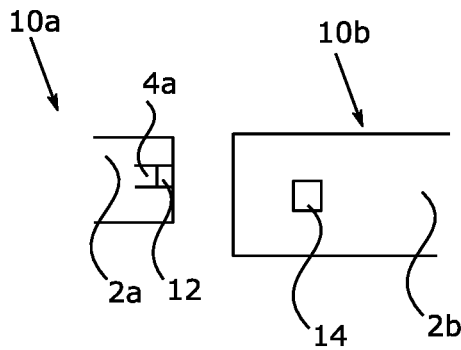
FIG. 5 is a diagram illustrating yet another example of a printed circuit board body.
Figure 6:
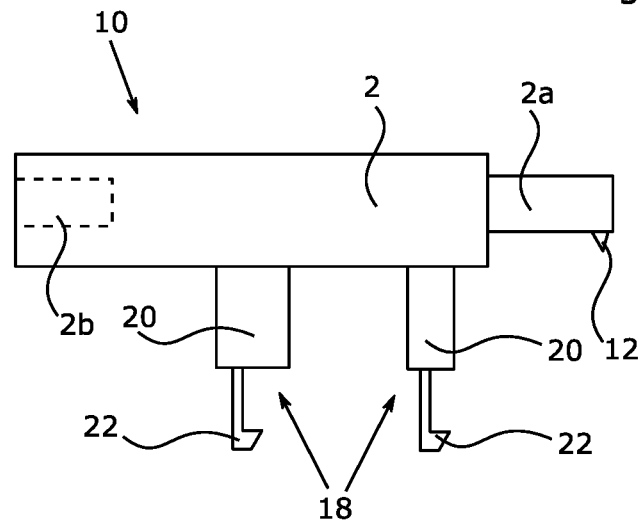
FIG. 6 is a diagram illustrating a side view of a further example of a printed circuited body with additional connecting elements.

FIGS. 4-6 are diagrams illustrating other examples of printed circuit boards.

Referring to FIGS. 4-6, the coupling means 4a of the first substrate part 2a can be formed as a clip to be inserted into an opening forming the receiving part 4b of the second substrate part 2b. The coupling means may include a hook-like or clip-like fastening element 12, which, upon connection of the first substrate part 2a to the second substrate part 2b hooks into a complementary receptor 14 of the receiving part 4b.

Additionally, the second substrate part 2b includes a heat sink 16, as illustrated in FIG. 4. The heat sink 16 can be provided as a thin metal sheet or foil which is inserted into an injection molding form before forming the second substrate part 2b by injecting a polymer mass into the mold. To thermally connect the heat sink 16 to the circuitry, a hole can be drilled through the body of the second substrate part and filled with solder, thus providing a connection with high thermal conductivity between the heat sink 16 and the circuitry.

FIG. 4 also shows a surface 22a, 22b of each substrate part 2a, 2b, respectively, which is suited for the application of a circuit (not shown) as soon as the two substrate parts 2a, 2b are connected by inserting the clip-like fastening element 12 into a slot like receiving part 4b.

FIG. 5 shows another embodiment with the coupling means 4a of the first substrate part 2a being in form of clips 12 and the complementary receiving portion 4b being provided as a pocket 14 within the second substrate part 2b.

Furthermore, as shown in FIG. 6, any substrate part 2 can include further connecting elements 18. In the embodiment shown in the figure, the connecting elements 18 include a body portion 20 and a hook portion 22. Both the body portion 20 and the hook portion 22 can be formed during the injection molding process. In another example, it is possible to provide the hook portion as an inlay which is embedded in the plastic of the substrate part body during injection molding as described for the heat sink 16. The connecting elements 18 can, for example, be used to fasten the substrate part 2 to a casing, a base plate or similar structural elements.

It is further possible to provide additional structural elements, such as reinforcing or bracing ribs, different forms of connecting elements and the like.

As soon as the first and second substrate parts 2a and 2b of one of the embodiments of FIGS. 4, 5 and 6 have been connected with each other, a not shown circuit can be applied on the respective surfaces 22a, 22b, for example, by a laser direct structuring method. In order to enhance stability as well as life period, soldering points can be added to the connection regions of the substrate parts 2a, 2b.

The principle and mode of operation of the invention has been described in certain embodiments. However, it should be noted that the invention may be practiced in other embodiments than those specifically illustrated and described without departing from its scope.

What is claimed is:

1. A method of manufacturing a printed circuit board, comprising:
    manufacturing a plurality of plastic substrate parts comprising one or more first plastic substrate parts and one or more second plastic substrate parts, with the first and second plastic substrate parts being formed in an injection molding process with each of the one or more first plastic substrate parts comprising at least one coupling means and each of the one or more second plastic substrate parts comprising at least one receiving means configured to receive the coupling means and with the first and second plastic substrate parts each being formed with a surface suited for application of a circuit;
    forming at least one of the first and second substrate parts with at least one further structural element, comprising at least one heat sink for dissipating thermal energy from the printed circuit board, by at least one of:
        providing a metal sheet or copper foil, coating the metal sheet or copper foil during an injection molding process, and thermally connecting the metal sheet to the circuit;
        providing the heat sink as an inlay, or a separate pan which is covered with polymer mass, during an injection molding process,
        forming the heat sink concomitantly with the circuit by applying metallic coating forming the conductor tracks during a step of providing the circuit,
    selecting and connecting at least one first substrate part and at least one second substrate part of the one or more first and second plastic substrate parts through the at least one coupling means and the at least one receiving means; and
    providing the connected first and second substrate parts with the circuit, with the circuit being applied by laser direct structuring (LDS), a molded interconnection device (MID) method, or printing on a surface suited for application of the circuit.

2. The method of claim 1, wherein the at least one further structural element comprises at least one of a clip connector, a positioning pin, a groove, and a ridge.

3. The method of claim 2, further comprising:
    providing a mold complementary to a form of the plurality of plastic substrate parts, the mold comprising at least one of the coupling means, receiving means and further structural element;
    injecting a polymer mass into the mold;
    cooling and unmolding a resulting substrate part such that at least one of the coupling means, the receiving means and the further structural element is formed with its respective substrate part in a single step of injection molding.

4. The method of claim 2, further comprising
    providing a mold complementary to a form of the plurality of plastic substrate parts;
    inserting at least one element forming at least part of the at least one of the coupling means, receiving means and further structural element into the mold before injecting the polymer mass; and
    cooling and unmolding a resulting substrate part such that at least one of the coupling means, the receiving means and the further structural element is formed with its respective substrate part.

5. The method of claim 2, wherein the at least one further structure element comprises at least one of a connector or a fastener for affixing the printed circuit board to other components, a positioning element, a guiding element, and a functional element for increasing mechanical stability of the printed circuit board.

6. The method of claim 1, wherein the plurality of plastic substrate parts comprises any material other than FR4 epoxy glass.

7. The method of claim 1, wherein the plurality of plastic substrate parts are manufactured from a resin.

8. The method of claim 5, wherein at least one of the coupling means, the further structural element, and the guiding element is configured to facilitate the connection of two substrate parts.

9. The method of claim 2, wherein at least one of the coupling means and the further structural element is configured to be coupled to or received by a receiving means of another substrate element.

10. The method of claim 1, wherein the coupling means is formed as a clip element, a tongue, or a hook, and the receiving means is formed as a slot, lug, pocket, recess, or undercut.

11. The method of claim 2, wherein the further structural element comprises a clip connector.

12. The method of claim 2, wherein the further structural element comprises a positioning pin or a groove.

13. The method of claim 2, wherein the further structural element comprises a bracing element or a ridge.

14. The method of claim 1, wherein the heat sink is thermally coupled to the printed circuit board as a whole or to individual regions of the printed circuit board which have a particularly high heat generation during operation.

15. The method of claim 1, wherein the at least one coupling means comprises a frictional connection, double friction surfaces, a positive locking keyed portion, an adhesive force, or a laser weld.

16. The method of claim 2, wherein the further structural element is configured to facilitate at least one of the application of the circuit by making transitions smooth, compensating relative movements between connected substrate parts, and compensating tolerances of substrate parts dimensions.

17. The method of claim 1, wherein the circuit element of the one or more first substrate parts is connected to the circuit element of the one or more second substrate parts by soldering and soldering points are placed in regions of transitions between two connected substrate parts.

18. The method of claim 17, wherein an amount of soldering substrate material is adapted to the transitions and two soldering points are provided.

19. The method of claim 1, wherein a layout of the circuit is configured to be adjusted depending on availability of the plastic substrate parts so that a first layout is used with a first availability and a second layout is used with a second availability.

20. The method of claim 1, further comprising forming at least one drill hole or bore into the connected substrate parts and at least partly filling with soldering material during the application of the circuit to enhance heat transfer to a heat sink.

21. The method of claim 1, wherein the plurality of plastic substrate parts are molded with a hole or a bore.

22. The method of claim 1, wherein at least a portion of the plurality of plastic substrate parts is flexible.

23. A method of manufacturing a printed circuit board, comprising:
  manufacturing a plurality of plastic substrate parts comprising one or more first plastic substrate parts and one or more second plastic substrate parts, with the first and second plastic substrate parts being formed in an injection molding process with each of the one or more first plastic substrate parts comprising at least one coupling means and each of the one or more second plastic substrate parts comprising at least one receiving means configured to receive the coupling means and with the first and second plastic substrate parts each being formed with a surface suited for application of a circuit;
  selecting and connecting at least one first substrate part and at least one second substrate part of the one or more first and second plastic substrate parts through the at least one coupling means and the at least one receiving means;
  providing the connected first and second substrate parts with a circuit, with the circuit being applied by laser direct structuring (LDS), a molded interconnection device (MID) method, or printing on a surface suited for application of the circuit; and
  forming at least one drill hole or bore into the connected substrate parts and at least partly filling with soldering material during the application of the circuit to enhance heat transfer to a heat sink.

* * * * *